United States Patent
Bode et al.

(10) Patent No.: US 6,823,231 B1
(45) Date of Patent: Nov. 23, 2004

(54) TUNING OF A PROCESS CONTROL BASED UPON LAYER DEPENDENCIES

(75) Inventors: Christopher A. Bode, Austin, TX (US); Alexander J. Pasadyn, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 183 days.

(21) Appl. No.: 10/303,307

(22) Filed: Nov. 25, 2002

(51) Int. Cl.$^7$ .............................................. G06F 19/00
(52) U.S. Cl. ............................ 700/121; 438/5; 438/14
(58) Field of Search ............................... 700/121, 117; 438/5–14

(56) References Cited

U.S. PATENT DOCUMENTS

| | | | | |
|---|---|---|---|---|
| 5,877,861 A | * | 3/1999 | Ausschnitt et al. | 356/401 |
| 6,405,096 B1 | * | 6/2002 | Toprac et al. | 700/121 |
| 6,408,220 B1 | * | 6/2002 | Nulman | 700/121 |
| 6,456,894 B1 | * | 9/2002 | Nulman | 700/121 |
| 6,484,060 B1 | * | 11/2002 | Baluswamy et al. | 700/58 |
| 6,622,061 B1 | * | 9/2003 | Toprac et al. | 700/121 |
| 6,675,053 B2 | * | 1/2004 | Baluswamy et al. | 700/58 |
| 6,735,492 B2 | * | 5/2004 | Conrad et al. | 700/121 |
| 6,766,211 B1 | * | 7/2004 | Ausschnitt | 700/117 |

OTHER PUBLICATIONS

"Analysis of the Determination of the dimensional Offset of Conduction Layers and MOS Transistors", Swaving et al., IEEE Transactions on Semiconductor Manufacturing, vol. 4, No. 3, Aug. 1991, pp. 174–182.*

"Multiple Objective APC Application for an Oxide CMP Process in a High Volumne Production Environment", Wollstein et al., IEEE International Semiconductor Manufacturing Symposium, Oct. 8–10, 2001, pp. 207–210.*

"A Comparison of Run–to–Run Control Algorithms", Campbell et al., Proceedings of the American Control Conference, May 8–10, 2002, pp. 2150–2155.*

* cited by examiner

Primary Examiner—Emanuel Todd Voeltz
(74) Attorney, Agent, or Firm—Williams, Morgan & Amerson, P.C.

(57) ABSTRACT

A method and an apparatus for selectively processing a layer of a workpiece based upon dependencies with other layers in the workpiece. A process step upon the workpiece is performed. Metrology data relating to the workpiece is acquired. A process adjustment relating to a first layer on the workpiece is calculated based upon the metrology data. A determination whether an error on a second layer on the workpiece would occur in response to an implementation of the process adjustment performed on the first layer. A magnitude of the calculated process adjustment is reduced in response to a determination that the second layer would be affected in response to the implementation of the process adjustment.

27 Claims, 7 Drawing Sheets

TUNING OF A PROCESS CONTROL BASED UPON LAYER DEPENDENCIES

BACKGROUND OF THE INVENTION

1. Field of the Invention

This invention relates generally to semiconductor manufacturing, and, more particularly, to a method and apparatus for selectively processing layers of a semiconductor wafer based upon layer dependencies.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Generally, a set of processing steps is performed across a group of semiconductor wafers, sometimes referred to as a lot. For example, a process layer that may be composed of a variety of different materials may be formed across a semiconductor wafer. Thereafter, a patterned layer of photoresist may be formed across the process layer using known photolithography techniques. Typically, an etch process is then performed across the process layer using the patterned layer of photoresist as a mask. This etching process results in the formation of various features or objects in the process layer. Such features may be used as, for example, a gate electrode structure for transistors. Many times, trench isolation structures are also formed across the substrate of the semiconductor wafer to isolate electrical areas across a semiconductor wafer. One example of an isolation structure that can be used is a shallow trench isolation (STI) structure.

The manufacturing tools within a semiconductor manufacturing facility typically communicate with a manufacturing framework or a network of processing modules. Each manufacturing tool is generally connected to an equipment interface. The equipment interface is connected to a machine interface to which a manufacturing network is connected, thereby facilitating communications between the manufacturing tool and the manufacturing framework. The machine interface can generally be part of an advanced process control (APC) system. The APC system initiates a control application, which can be a software program that automatically retrieves the data needed to execute a manufacturing process.

FIG. 1 illustrates a typical semiconductor wafer 105. The semiconductor wafer 105 typically includes a plurality of individual semiconductor die 103 arranged in a grid 150. Using known photolithography processes and equipment, a patterned layer of photoresist may be formed across one or more process layers that are to be patterned. As part of the photolithography process, an exposure process is typically performed by a stepper on multiple die 103 locations at a time, depending on the specific photomask employed. The patterned photoresist layer can be used as a mask during etching processes, wet or dry, performed on the underlying layer or layers of material, e.g., a layer of polysilicon, metal, or insulating material, to transfer the desired pattern to the underlying layer. The patterned layer of photoresist is comprised of a plurality of features, e.g., line-type features or opening-type features that are to be replicated in an underlying process layer.

Turning now to FIG. 2, a typical flow of processes performed on a semiconductor wafer 105 by a semiconductor manufacturing system is illustrated. A manufacturing system processes semiconductor wafers 105 from a batch/lot (block 210). Upon processing semiconductor wafers 105, the manufacturing system may acquire metrology data relating to the processed semiconductor wafers 105 (block 220). Based upon the analysis of the metrology data, the manufacturing system may determine one or more process control modifications that may be implemented on subsequent processes performed on the semiconductor wafers 105 (block 230). The manufacturing system may then process subsequent semiconductor wafers 105 based upon the process modifications calculated (block 240). The process modification may include modifying several features on a layer on the wafer 105 that may result in overlay misalignment of the layer relative to other layers on the semiconductor wafers 105.

One problem associated with the current methodology includes the fact that a modification made upon a target layer (i.e., a layer targeted for process control modifications) may cause adverse affects on subsequent layers formed on the semiconductor wafers 105. For example, process modifications may be made to a particular feature on a target layer, resulting in a change in the alignment of the feature relative to the alignment of corresponding features on subsequently formed layers. In the context of a photolithography process, control adjustments performed on one layer may adversely affect a plurality of other layers due to a shift in the alignment of features on various layers of the semiconductor wafers 105. Generally, process control adjustments are made to features on layers on a wafer 105 based upon control adjustments calculated for. improvements in accuracy when processing semiconductor wafers 105. However, utilizing the current methodology, corrections made to one layer may cause misalignment problems such that the overall accuracy and reliability of the semiconductor wafer 105 may be compromised.

The present invention is directed to overcoming, or at least reducing, the effects of, one or more of the problems set forth above.

SUMMARY OF THE INVENTION

In one aspect of the present invention, a method is provided for selectively processing a layer of a workpiece based upon dependencies with other layers in the workpiece. A process step upon a workpiece is performed. Metrology data relating to the workpiece is acquired. A process adjustment relating to a first layer on the workpiece is calculated based upon the metrology data. A determination whether an error on a second layer on the workpiece would occur in response to an implementation of the process adjustment performed on the first layer. A magnitude of the calculated process adjustment is reduced in response to a determination that the second layer would be affected in response to the implementation of the process adjustment.

In another aspect of the present invention, a system is provided for selectively processing a layer of a workpiece based upon dependencies with other layers in the workpiece. The system includes a processing tool to process a workpiece. The system also includes a process controller operatively coupled to the processing tool. The process controller is capable of performing a control tuning function. The control tuning function includes calculating a process adjustment relating to a first layer on the workpiece based upon metrology data. The control tuning function also includes reducing a magnitude of the calculated process adjustment in response to a determination that an overlay misalignment of the first and the subsequent layer would occur in response to an implementation of the calculated process adjustment upon the first layer.

In another aspect of the present invention, an apparatus is provided for selectively processing a layer of a workpiece based upon dependencies with other layers in the workpiece. The apparatus includes a process controller adapted to perform a control tuning function for processing a workpiece. The control tuning function includes calculating a process adjustment relating to a first layer on the workpiece based upon metrology data. The control tuning function also includes reducing a magnitude of the calculated process adjustment in response to a determination that an overlay misalignment of the first and the subsequent layer would occur in response to an implementation of the calculated process adjustment upon the first layer.

In yet another aspect of the present invention, a computer readable program storage device encoded with instructions is provided for selectively processing a layer of a workpiece based upon dependencies with other layers in the workpiece. The computer readable program storage device encoded with instructions that, when executed by a computer, performs a method, which comprises: performing a process step upon a workpiece; acquiring metrology data relating to the workpiece; calculating a process adjustment relating to a first layer on the workpiece based upon the metrology data; determining whether a second layer on the workpiece would be affected in response to an implementation of the process adjustment performed on the first layer; and reducing a magnitude of the calculated process adjustment in response to a determination that the second layer would be affected in response to the implementation of the process adjustment.

BRIEF DESCRIPTION OF THE DRAWINGS

The invention may be understood by reference to the following description taken in conjunction with the accompanying drawings, in which like reference numerals identify like elements, and in which.

Figure 1:
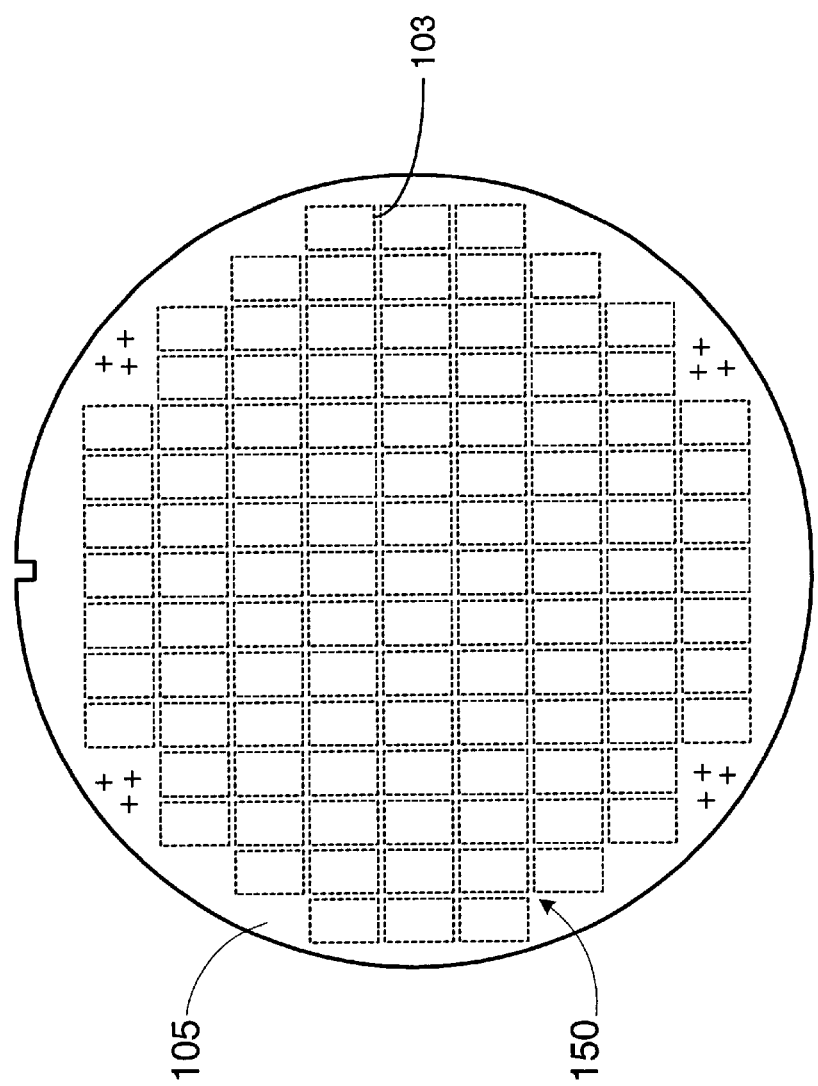
FIG. 1 is a simplified diagram of a prior art semiconductor wafer being processed.
Figure 2:
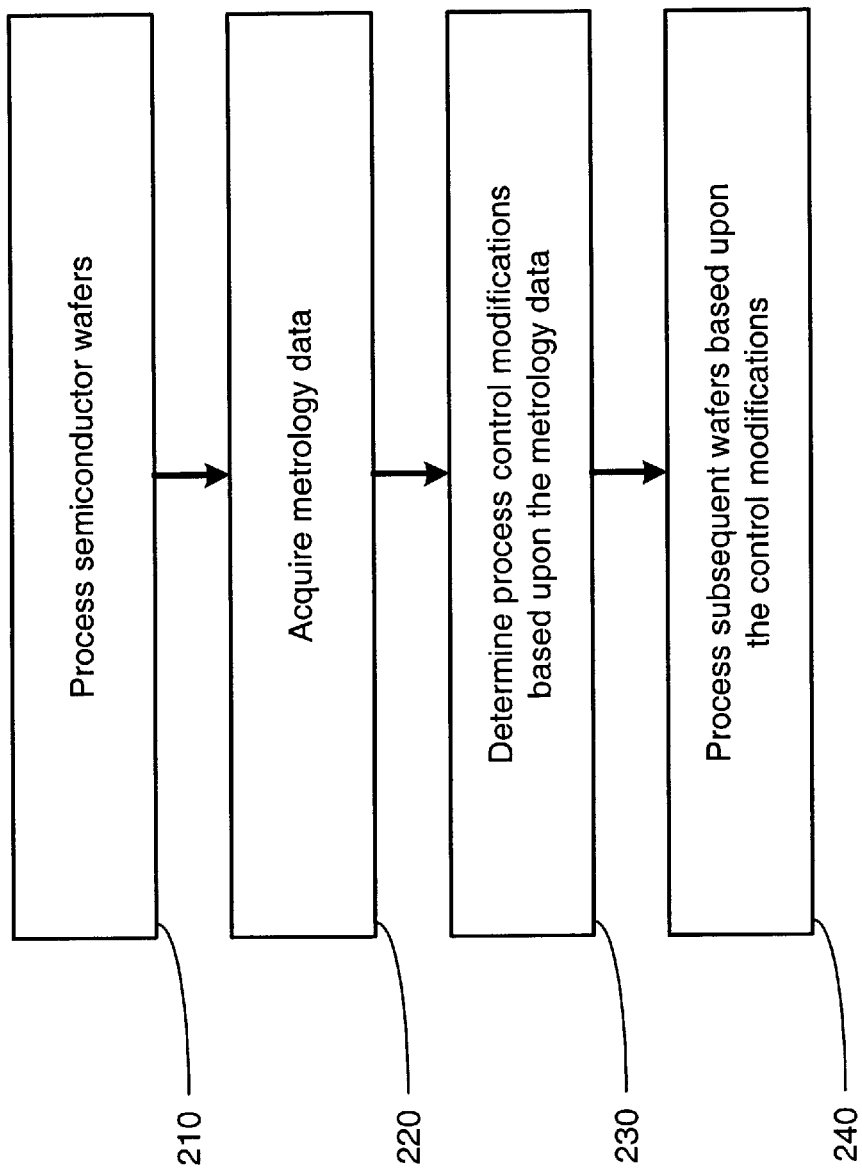
FIG. 2 illustrates a simplified flowchart depiction of a prior art process flow during manufacturing of semiconductor wafers.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There are many discrete processes that are involved in semiconductor manufacturing. Many times, workpieces (e.g., semiconductor wafers 105, semiconductor devices, etc.) are stepped through multiple manufacturing process tools. Embodiments of the present invention provide for processing a plurality of layers on a semiconductor wafers 105 and acquiring metrology data related to the processed layers. Varied control adjustments may be performed on selected layers, such that subsequently processed layers on the semiconductor wafers 105 are not adversely affected. A control tuning process may be performed such that the magnitude of a control adjustment that may normally be performed on a target layer of a wafer 105, is attenuated to reduce adverse affects upon subsequently processed layers.

During photolithography processes, control operations performed on one layer may affect a plurality of other layers on the semiconductor wafers 105. For example, a target layer on the semiconductor wafers 105 may house a reference pattern or feature that may correspond to patterns or features formed on a plurality of other layers. Therefore, modifications performed on the reference pattern may affect a plurality of other layers. A control modification performed on a target layer, which may comprise a reference pattern, may cause overlay misalignment of the target layer relative to subsequent layers formed on the wafer 105. Therefore, a reduced control adjustment may be selectively performed upon a layer to reduce the possibility of overlay misalignment with other layers on the wafer 105. A layer may be examined for certain patterns. If a target layer predominantly does not have reference patterns or features that are related to features on other layers, more aggressive process controlled modifications may be implemented upon the target layer without substantially affecting alignment with subsequent layers. For layers comprising features (e.g., reference patterns) where alignment with other layers is more important, less aggressive process control adjustments may be implemented.

Figure 3:
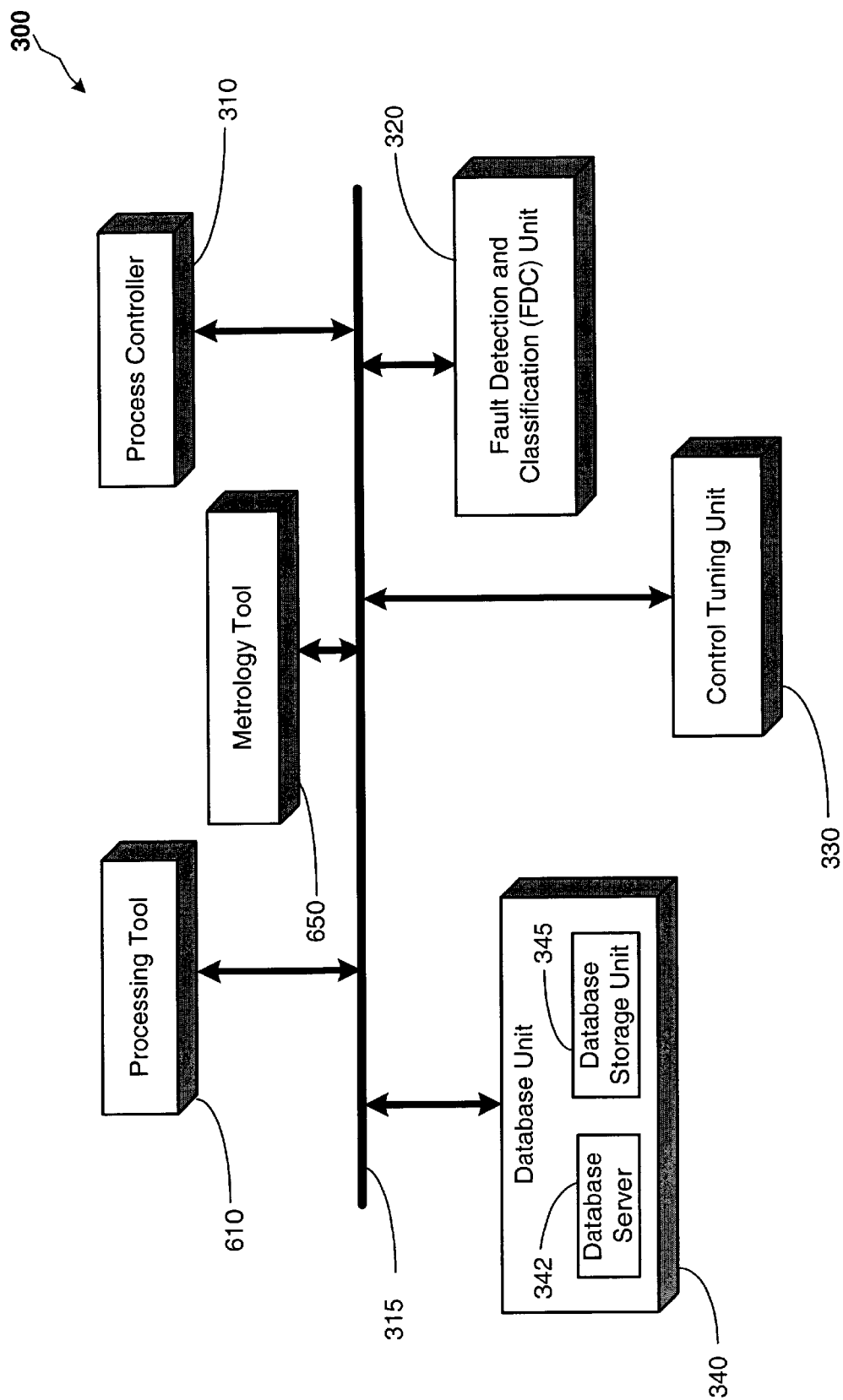
FIG. 3 provides a block diagram representation of a system in accordance with one illustrative embodiment of the present invention.

Turning now to FIG. 3, a block diagram depiction of a system 300 in accordance with embodiments of the present invention is illustrated. A process controller 310 in the system 300 is capable of controlling various operations relating to a processing tool 510. The system 300 is capable of acquiring manufacturing related data, such as metrology data, related to processed semiconductor wafers 105, tool state data, and the like. The system 300 may also comprise a metrology tool 550 to acquire metrology data related to the processed semiconductor wafers 105.

The system 300 may also comprise a database unit 340. The database unit 340 is provided for storing a plurality of types of data, such as manufacturing related data, or data related to the operation of the system 300 (e.g., the status of the processing tool 510, the status of semiconductor wafers 105, etc.). The database unit 340 may store tool state data relating to a plurality of process runs performed by the processing tool 510. The database unit 340 may comprise a database server 342 for storing tool state data and/or other manufacturing data related to processing semiconductor wafers 105, into a database storage unit 345.

The system 300 may also comprise a fault detection and classification (FDC) unit 320. The fault detection and classification unit 320 is capable of providing data relating to faults during processing of semiconductor wafer 105. Fault detection analysis performed by the fault detection and classification unit 320 may include analysis of tool state data and/or metrology data. The FDC unit 320 may correlate particular tool state data to errors detected on the processed semiconductor wafer 105 by analyzing the metrology tool data. For example, particular errors, such as critical dimension errors discovered on the processed semiconductor wafers 105 may be correlated to particular gas flow rates or temperature data relating to tool state data. The fault detection performed by the FDC unit 320 may also include analyzing data from in situ sensors integrated into the processing tools 510. Based upon the fault detection analysis provided by the FDC unit 320, the system 300 may perform a modification to a previously or predetermined routing scheme determined by the system 300.

Upon analysis of the metrology data and/or the fault detection data, the system 300 may determine that a process control adjustment is to be made upon a process layer formed on a semiconductor wafer 105. A control tuning unit 330 in the system 300 is capable of attenuating the calculated process adjustment on a layer and discriminate on a layer-by-layer basis whether to implement the calculated control adjustment. In other words, the control tuning unit 330 may determine that a particular layer may not be suitable for a calculated control adjustment, therefore, a less aggressive, attenuated control adjustment may be performed on a particular layer. Additionally, the control tuning unit 330 may determine that the control adjustment to be performed upon a particular site on a layer should be attenuated to preserve proper alignment between various layers on the semiconductor wafer 105. In one embodiment, the attenuation of the control adjustments that are calculated may be performed to reduce misalignment of various layers on the semiconductor wafer 105.

The control tuning unit 330 may determine that a full-force control adjustment performed on a target layer may adversely affect the alignment of features on that layer with corresponding features on other layers on the semiconductor wafers 105. Therefore, a less aggressive control adjustment may be implemented. Corresponding features on layers may include various structures of a transistor, such as gate regions, source regions, drain regions, and the like. For features on the layer that generally do not have corresponding features on other layers, e.g., implant regions on a layer, control modifications as originally calculated are implemented, without attenuation of the control modifications. The control tuning unit 330 may determine that another layer may be adjusted such that substantial adverse affects on subsequent layers may not take place, therefore, more aggressive control adjustments may be performed on those layers. In other words, for features on the layer that generally do not have corresponding features on other layers, e.g., implant regions on a layer, control modifications as originally calculated are implemented, without attenuation of the control modifications. Therefore, the control tuning unit 330 provides for discriminating on a layer-by-layer and/or a site-by-site basis whether to attenuate a control adjustment performed on particular layers. This may be particularly applicable to photolithography type processes here alignment of layers and/or alignment of features formed on the layers are relevant. A more detailed description of the control tuning unit 330 is provided in FIG. 4 and accompanying description below.

The process controller 310, the FDC unit 320, and/or the control tuning unit 330 may be software, hardware, or firmware units that are standalone units or may be integrated into a computer system associated with the system 300. Furthermore, the various components represented by the blocks illustrated in FIG. 3 may communicate with one another via a system communications line 315. The system communications line 315 may be a computer bus link, a dedicated hardware communications link, a telephone system communications link, a wireless communications link, or other communication links that may be implemented by those skilled in the art having benefit of the present disclosure.

Generally, there are at least two types of masking processes performed on semiconductor wafers 105 during photolithography processes. One type of masking process provides for placing patterns or features on a first/target layer on the semiconductor wafers 105 where corresponding features on subsequent layers are not formed. Therefore, subsequently processed layers may not need to be aligned substantially with the first layer. An example of such a process is a masking process that is used in an implant process, which generally does not act as a reference for features formed on the other layer.

The second type of masking provides for placing patterns (i.e., reference patterns) that do affect alignment with other layers, for example, shallow isolation trenches; gate, source, or drain structures for a transistor; and the like. In other words, the target layer may comprise features that are associated with other corresponding features on subsequent layers formed on the semiconductor wafer 105. Therefore, the target layer may house features that are to be substantially aligned with corresponding features on subsequently formed layers. Therefore, alignment of these layers is more relevant. Embodiments of the present invention provide for discriminating between layers that comprise patterns or features that do not affect other layers, and layers that comprise patterns/features that do affect other layers. Based upon such discrimination, aggressive, or alternatively, more passive control adjustments may be performed on a particular layer depending on the type of features formed on the layer.

Figure 4:
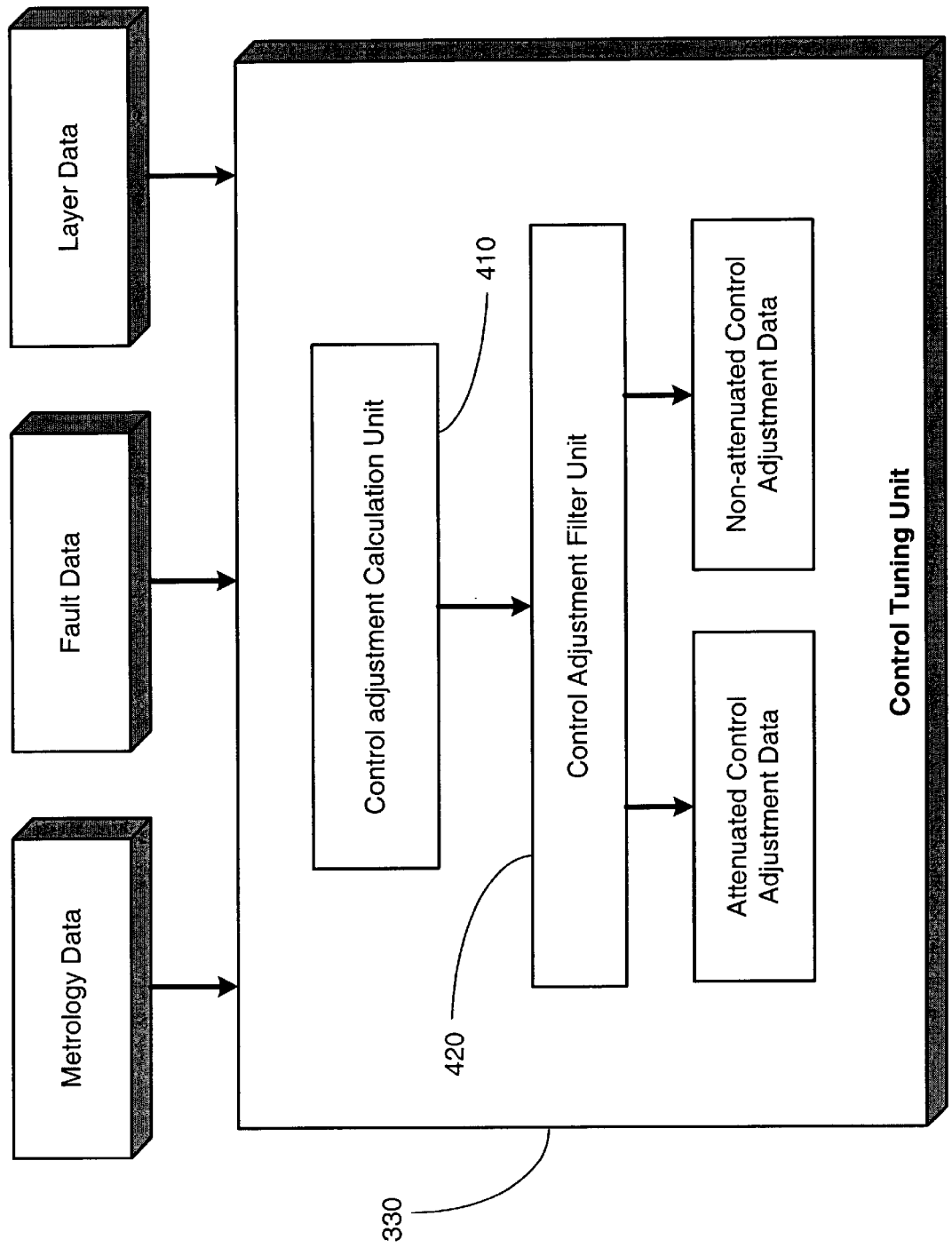
FIG. 4 illustrates a more detailed block diagram representation of a control tuning unit of FIG. 3, in accordance with one illustrative embodiment of the present invention.

Turning now to FIG. 4, a more detailed block diagram depiction of the control tuning unit 330 in accordance with one illustrative embodiment of the present invention is illustrated. Metrology data, fault data, and/or data relating to various layers formed on the semiconductor wafers 105 may be received by the control tuning unit 330. The control tuning unit 330 may comprise a control adjustment calculation unit 410 and a control adjustment filter unit 420. Based upon the metrology data, the fault data, and/or the layer data, the control adjustment calculation unit 410 may calculate a process control adjustment to be performed on a layer to correct errors found on the semiconductor wafers 105.

The control adjustment filter unit 420 may filter certain control adjustment calculations based upon the nature of features on particular layers. The control adjustment filter unit 420 may filter out some or all of certain calculated control adjustments in order to make the control process less aggressive when implementing control adjustments on certain layers. In one embodiment, the magnitude of the modifications prescribed by the control adjustment calculation is reduced to implement smaller control adjustments, thereby decreasing the possibility of overlay misalignment when performing photolithography processes. This attenuation is performed on control adjustments made to layers where, if fully implemented, adverse affects (e.g., overlay misalignment with other layers) upon other layers may occur. For example, during an implant mask process performed on a semiconductor wafer 105, where masking of part of the semiconductor wafer 105 to implant dopants into the substrate is performed, a non-attenuated control adjustment may be performed since the implant process produces features that generally do not have to be substantially aligned with other features on other layers on the semiconductor wafer 105. Therefore, the system 300 may perform control adjustments that may be more aggressive since downstream dependencies are not substantial.

For layers formed on the semiconductor wafers 105 that comprise features such as shallow isolation trenches, source/drain regions, active regions of a transistor, contact metal via layer, etc., an attenuated version of the calculated control adjustment may be implemented since a non-attenuated control adjustment performed on such layers may adversely affect alignment with other layers. Therefore, the control adjustment filter unit 420 may filter out certain control adjustment calculations to reduce overlay misalignment among various layers when controlling a target layer on the wafer 105. The control adjustment filter unit 420 generates attenuated control adjustment data, which may be used by the system 300 to perform attenuated control adjustments on alignment-sensitive layers on the semiconductor wafer 105. The control tuning unit 330 may provide attenuated and non-attenuated control adjustment data to be used by the process controller 310 to selectively implement control adjustments to certain layers on the semiconductor wafer 105.

Figure 5:
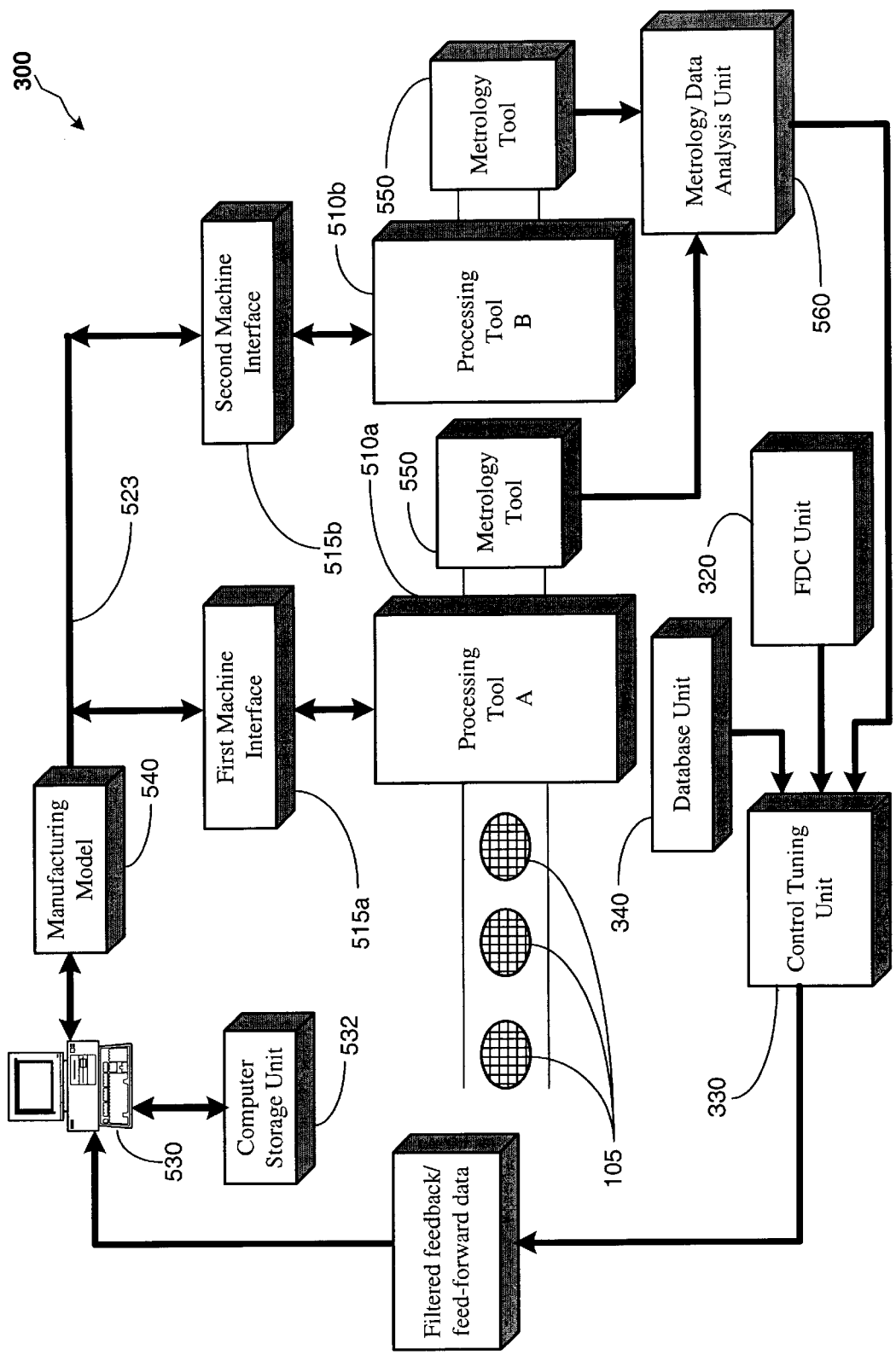
FIG. 5 illustrates a more detailed block diagram representation of the system shown in FIG. 3, in accordance with one illustrative embodiment of the present invention.

Turning now to FIG. 5, a more detailed block diagram of the system 300 in accordance with one embodiment of the present invention is illustrated. Semiconductor wafers 105 are processed on processing tools 510*a*, 510*b* using a plurality of control input signals, or manufacturing parameters, provided via a line or network 523. The control input signals, or manufacturing parameters, on the line 523 are sent to the processing tools 510*a*, 510*b* from a computer system 530 via machine interfaces 515*a*, 515*b*. The first and second machine interfaces 515*a*, 515*b* are generally located outside the processing tools 510*a*, 510*b*. In an alternative embodiment, the first and second machine interfaces 515*a*, 515*b* are located within the processing tools 510*a*, 510*b*. The semiconductor wafers 105 are provided to and carried from a plurality of processing tools 510. In one embodiment, semiconductor wafers 105 may be provided to a processing tool 510 manually. In an alternative embodiment, semiconductor wafers 105 may be provided to a processing tool 510 in an automatic fashion (e.g., robotic movement of semiconductor wafers 105). In one embodiment, a plurality of semiconductor wafers 105 is transported in lots (e.g., stacked in cassettes) to the processing tools 510.

In one embodiment, the computer system 530 sends control input signals, or manufacturing parameters, on the line 523 to the first and second machine interfaces 515*a*, 515*b*. The computer system 530 is capable of controlling processing operations. In one embodiment, the computer system 530 is a process controller. The computer' system 530 is coupled to a computer storage unit 532 that may contain a plurality of software programs and data sets. The computer system 530 may contain one or more processors (not shown) that are capable of performing the operations described herein. The computer system 530 employs a manufacturing model 540 to generate control input signals on the line 523. In one embodiment, the manufacturing model 540 contains a manufacturing recipe that determines a plurality of control input parameters that are sent on the line 523 to the processing tools 510*a*, 510*b*.

In one embodiment, the manufacturing model 540 defines a process script and input control that implement a particular manufacturing process. The control input signals (or control input parameters) on the line 523 that are intended for processing tool A 510*a* are received and processed by the first machine interface 515*a*. The control input signals on the line 523 that are intended for processing tool B 510*b* are received and processed by the second machine interface 515*b*. Examples of the processing tools 510*a*, 510*b* used in semiconductor manufacturing processes are steppers, etch process tools, deposition tools, and the like.

One or more of the semiconductor wafers 105 that are processed by the processing tools 510*a*, 510*b* can also be sent to a metrology tool 550 for acquisition of metrology data. The metrology tool 550 may be a scatterometry data acquisition tool, an overlay-error measurement tool, a critical dimension measurement tool, and the like. In one embodiment, a metrology tool 550 examines one or more processed semiconductor wafers 105. The metrology data analysis unit 560 may collect, organize, and analyze data from the metrology tool 550. The metrology data is directed to a variety of physical or electrical characteristics of the devices formed across the semiconductor wafers 105. For example, metrology data may be obtained as to line width measurements, depth of trenches, sidewall angles, thickness, resistance, and the like. Metrology data may be used to determine faults that may be present across the processed semiconductor wafers 105, which may be used to quantify the performance of the processing tools 510.

As provided above, the control tuning unit 330 may receive metrology data from the metrology data analysis unit 560, fault detection data from the FDC unit 320, and/or stored manufacturing data from the database unit 340. The database unit 340 may provide data relating to features formed on particular layers on semiconductor wafer 105. The control tuning unit 330 may then provide attenuated and non-attenuated control adjustment signals based upon which layer is being targeted, to the computer system 530. The control tuning unit 330 may provide filtered feedback/feed forward data that may be used to selectively and discriminatingly control some layers aggressively while more passively controlling other layers such that acceptable alignment among various layers formed on the wafer 105 is maintained.

Figure 6:
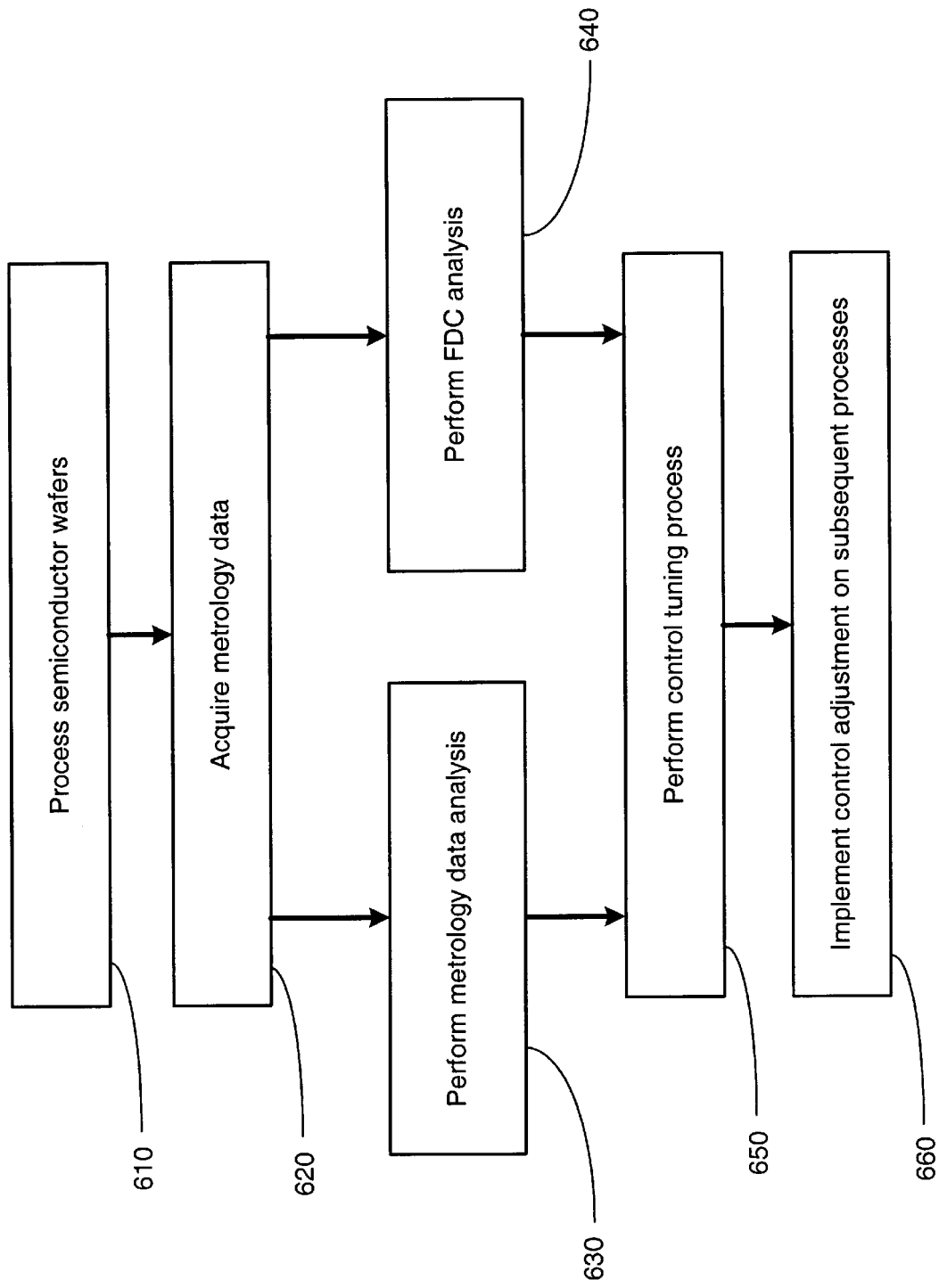
FIG. 6 illustrates a flowchart depiction of a method in accordance with one illustrative embodiment of the present invention.

Turning now to FIG. 6, a flow chart depiction of the method in accordance with embodiments of the present invention is illustrated. The system 300 processes semiconductor wafers 105 that may be associated with a lot/batch (block 610). Upon processing the semiconductor wafers 105, the system 300 may acquire metrology data relating to the processed semiconductor wafers 105 (block 620). The system 300 may perform a metrology data analysis to analyze errors that may occur on layers formed on the semiconductor wafers 105 (block 630). Furthermore, the system 300 may perform FDC analysis (block 640) to generate fault data associated with processing of semiconductor wafers 105. The system 300 may then perform a control tuning process utilizing stored data, metrology data analysis, and/or the fault detection data to selectively affect appropriate process control adjustments performed on layers formed on the semiconductor wafers 105 (block 650). The control tuning process provides attenuated and/or non-attenuated control adjustment data that is selectively used to aggressively adjust some layers while more passively adjusting other layers. The system 300 then implements the control adjustments on subsequent processes performed on the semiconductor wafers 105 based upon the attenuated and non-attenuated control adjustment calculations (block 660).

Figure 7:
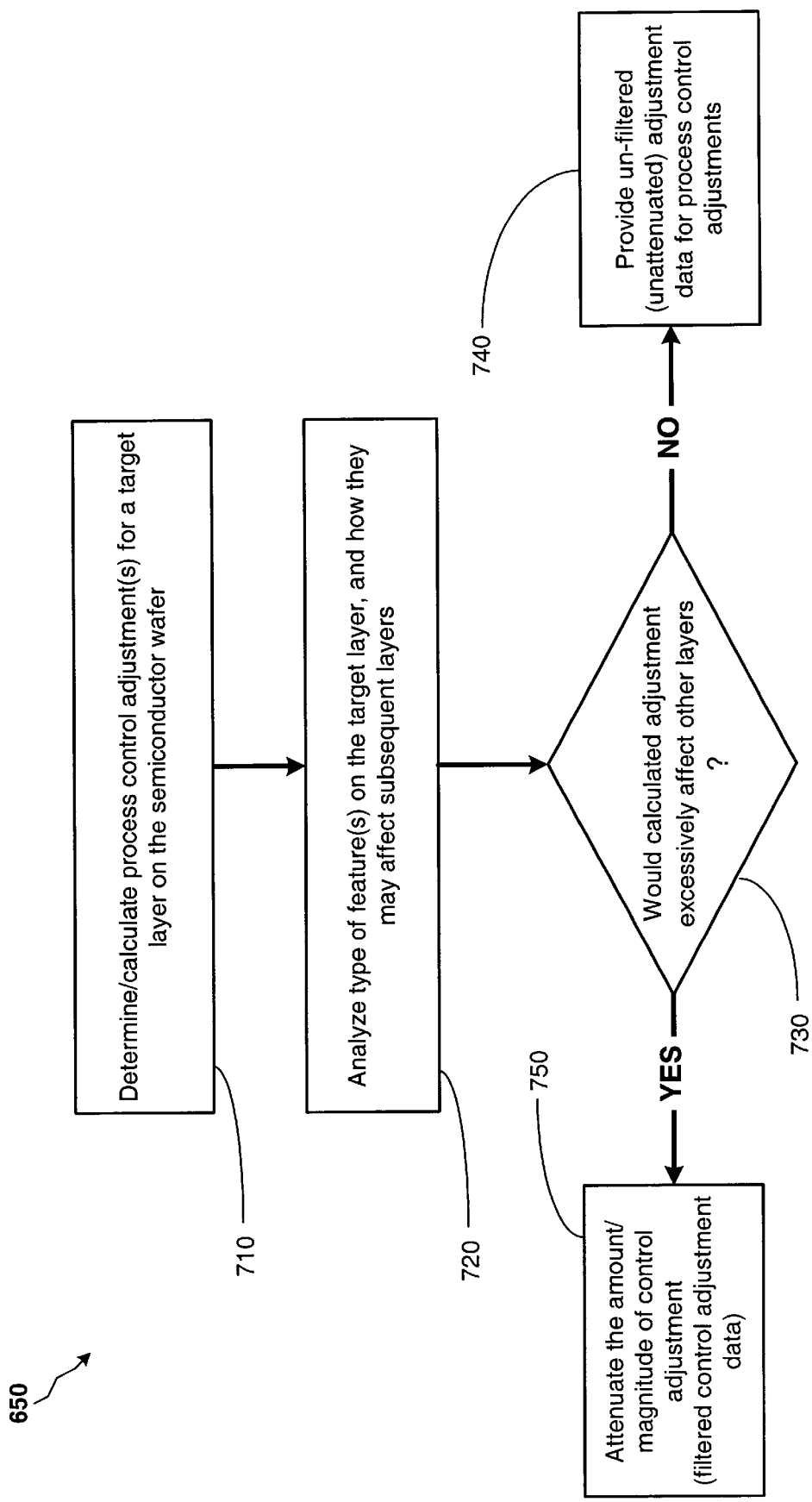
FIG. 7 illustrates a more detailed flowchart depiction of a method of performing a control tuning process, as indicated in FIG. 6, in accordance with one illustrative embodiment of the present invention.

Turning now to FIG. 7, a more detailed flow chart depiction of the step of performing the control tuning process indicated in block 650 of FIG. 6 is illustrated. The system 300 determines process control adjustments that are calculated (block 710). These process control adjustments call for performing control modifications such that errors detected on the layers of the semiconductor wafers 105 are diminished. Based upon the calculated adjustments, the system 300 may analyze a layer to determine which types of features formed on the layer are to be adjusted, and how these features affect other layers (block 720). For example, the system 300 may check for certain features such as shallow isolation trenches, gate structures of transistors, and the like, to determine whether a layer contains features that affect alignment with other layers.

The system 300 makes a determination whether the calculated adjustment, if implemented, would excessively affect other layers based upon the features formed on the layers (block 730). In other words, the system 300 determines whether control modification implemented on a target layer would affect overlay alignment with subsequently processed layers on the wafer 105. When the system 300 determines that the calculated adjustment does not excessively affect other layers, the unfiltered adjustment calculation data (i.e., the non-attenuated control adjustment data) is used to perform the control adjustments (block 740). However, when the system 300 determines that the calculated adjustment may excessively affect other layers on the semiconductor wafers 105, the system 300 attenuates the amount/magnitude of the control adjustments, such that the adjustment would be less aggressive. After attenuating the process adjustment, the system 300 checks to see if such attenuated adjustment would excessively affect other layers. When a determination is made that implementation of the control adjustment(s) on target layer may not adversely affect subsequently processed layers, the attenuated control adjustment data is used to perform control adjustments on the target layer.

Utilizing embodiments of the present invention, discriminatingly selecting certain layers for aggressive control adjustment and other layers for more passive control adjustments provide for maintaining more accurate alignment among various layers formed on semiconductor wafers 105.

During photolithography processes, these methods can be used to maintain proper overlay alignments such that structures that are more reliable are formed on layers of the semiconductor wafers 105. This may result in increased yields and more accurately processed semiconductor wafers 105.

The principles taught by the present invention can be implemented in an Advanced Process Control (APC) Framework, such as a Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI. The APC framework is a preferred platform from which to implement the control strategy taught by the present invention. In some embodiments, the APC framework can be a factory-wide software system; therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC framework allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller, such as the overlay controller. The control methods are generally defined and performed in these scripts. The development of these scripts can comprise a significant portion of the development of a control system. The principles taught by the present invention can be implemented into other types of manufacturing frameworks.

The particular embodiments disclosed above are illustrative only, as the invention ay be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:

performing a process step upon a workpiece;

acquiring metrology data relating to said workpiece;

calculating a process adjustment relating to a first layer on said workpiece based upon said metrology data;

determining whether an error on a second layer on said workpiece would occur in response to an implementation of said process adjustment performed on said first layer; and reducing a magnitude of said calculated process adjustment in response to a determination that an error on said second layer would occur in response to said implementation of said process adjustment.

2. The method of claim 1, wherein performing said process step upon said workpieces further comprises performing said process step upon a semiconductor wafer.

3. The method of claim 1, wherein determining whether an error on said second layer would occur in response to said implementation of said process adjustment upon said first layer further comprises determining whether an overlay misalignment between said first and second layer will occur in response to said implementation of said process adjustment.

4. The method of claim 1, wherein reducing said magnitude of said calculated process adjustment further comprises reducing the amount of process control modification implemented upon said first layer.

5. The method of claim 4, wherein reducing said magnitude of said calculated process adjustment further comprises reducing an amount of process control modification performed upon a first feature on said first layer that is aligned with a second feature upon said second layer.

6. The method of claim 5, wherein reducing said amount of process control modification performed upon said first feature on said first layer further comprises reducing an amount of process control modification performed upon a trench formation on said first layer.

7. The method of claim 1, further comprising implementing said calculated process adjustment upon said first layer in response to a determination that said second layer would not be adversely affected by said implementation of said process adjustment upon said first layer.

8. The method of claim 7, wherein implementing said calculated process adjustment upon said first layer further comprises implementing said calculated process adjustment upon an implant site on said workpiece.

9. The method of claim 1, wherein reducing said magnitude of said calculated process adjustment further comprises filtering said calculated process adjustment to reduce an impact of implementing a control modification based upon said calculated process adjustment.

10. A method, comprising:
performing a process step upon a first layer of a workpiece;
acquiring metrology data relating to said workpiece;
calculating a process adjustment relating to said first layer on said workpiece based upon said metrology data;
determining whether an overlay misalignment between said first and a subsequent layer on said workpiece would occur in response to an implementation of said process adjustment performed on said first layer; and
reducing a magnitude of said calculated process adjustment in response to a determination that said overlay misalignment would occur in response to said implementation of said process adjustment.

11. An apparatus, comprising:
means for performing a process step upon a workpiece;
means for acquiring metrology data relating to said workpiece;
means for calculating a process adjustment relating to a first layer on said workpiece based upon said metrology data;
means for determining whether an error on a second layer on said workpiece would occur in response to an implementation of said process adjustment performed on said first layer; and
means for reducing a magnitude of said calculated process adjustment in response to a determination that an error on said second layer would occur in response to said implementation of said process adjustment.

12. A system, comprising:
a processing tool to process a workpiece; and
a process controller operatively coupled to said processing tool, said process controller to perform a control tuning function, said control tuning function comprising calculating a process adjustment relating to a first layer on said workpiece based upon metrology data, and reducing a magnitude of said calculated process adjustment in response to a determination that an overlay misalignment of said first and said subsequent layer would occur in response to an implementation of said calculated process adjustment performed on said first layer.

13. The system of claim 12, wherein said workpiece is a semiconductor wafer.

14. The system of claim 12, further comprising:
a metrology tool operatively coupled to said process controller and to said processing tool, said metrology tool to acquire metrology data relating to said processed workpiece;
a fault detection and classification (FDC) unit operatively coupled to said process controller, said fault detection and classification unit to perform said fault detection process; and
a control tuning unit operatively coupled to said process controller, said control tuning unit to determine whether said magnitude of said calculated process adjustment is to be reduced.

15. The system of claim 14, further comprising a database unit to store said at least one of metrology data, said tool state data, and said electrical test data.

16. An apparatus, comprising:
a process controller to perform a control tuning function for processing a workpiece, said control tuning function comprising calculating a process adjustment relating to a first layer on said workpiece based upon metrology data, and reducing a magnitude of said calculated process adjustment in response to a determination that an overlay misalignment of said first and said subsequent layer would occur in response to an implementation of said calculated process adjustment performed on said first layer.

17. The apparatus of claim 16, wherein said workpiece is a semiconductor wafer.

18. The apparatus of claim 16, further comprising:
a metrology tool operatively coupled to said process controller and to said processing tool, said metrology tool to acquire metrology data relating to said processed workpiece;
a fault detection and classification (FDC) unit operatively coupled to said process controller, said fault detection and classification unit to perform said fault detection process; and
a control tuning unit operatively coupled to said process controller, said control tuning unit to determine whether said magnitude of said calculated process adjustment is to be reduced.

19. A computer readable program storage device encoded with instructions that, when executed by a computer, performs a method, comprising:
performing a process step upon a workpiece;

acquiring metrology data relating to said workpiece;

calculating a process adjustment relating to a first layer on said workpiece based upon said metrology data;

determining whether an error on a second layer on said workpiece would occur in response to an implementation of said process adjustment performed on said first layer; and reducing a magnitude of said calculated process adjustment in response to a determination that an error on said second layer would occur in response to said implementation of said process adjustment.

20. The computer readable program storage device encoded with instructions that, when executed by a computer, performs the method of claim 19, wherein performing said process step upon said workpiece further comprises performing said process step upon a semiconductor wafer.

21. The computer readable program storage device encoded with instructions that, when executed by a computer, performs the method of claim 19, wherein determining whether said second layer would be affected in response to said implementation of said process adjustment upon said first layer further comprises determining whether an overlay misalignment between said first and second layer will occur in response to said implementation of said process adjustment.

22. The computer readable program storage device encoded with instructions that, when executed by a computer, performs the method of claim 19, wherein reducing a magnitude of said calculated process adjustment further comprises reducing the amount of process control modification implemented upon said first layer.

23. The computer readable program storage device encoded with instructions that, when executed by a computer, performs the method of claim 22, wherein reducing said magnitude of said calculated process adjustment further comprises reducing said amount of process control modification performed upon a first feature on said first layer that is aligned with a second feature upon said second layer.

24. The computer readable program storage device encoded with instructions that, when executed by a computer, performs the method of claim 23, wherein reducing said amount of process control modification performed upon said first feature on said first layer further comprises reducing said amount of process control modification performed upon trench formation on said first layer.

25. The computer readable program storage device encoded with instructions that, when executed by a computer, performs the method of claim 19, further comprising implementing said calculated process adjustment upon said first layer in response to a determination that said second layer would not be adversely affected by said implementation of said process adjustment upon said first layer.

26. The computer readable program storage device encoded with instructions that, when executed by a computer, performs the method of claim 25, wherein implementing said calculated process adjustment upon said first layer further comprises implementing said calculated process adjustment upon an implant site on said workpiece.

27. The computer readable program storage device encoded with instructions that, when executed by a computer, performs the method of claim 19, wherein reducing said magnitude of said calculated process adjustment further comprises filtering said calculated process adjustment to reduce an impact of implementing a control modification based upon said calculated process adjustment.

* * * * *